US009077508B2

(12) United States Patent
Koike-Akino et al.

(10) Patent No.: US 9,077,508 B2
(45) Date of Patent: Jul. 7, 2015

(54) ADAPTIVELY CODING AND MODULATING SIGNALS TRANSMITTED VIA NONLINEAR CHANNELS

(71) Applicant: Mitsubishi Electric Research Laboratories, Inc., Cambridge, MA (US)

(72) Inventors: Toshiaki Koike-Akino, Medford, MA (US); Kieran Parsons, Cambridge, MA (US); Chunjie Duan, Brookline, MA (US); Keisuke Kojima, Weston, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 111 days.

(21) Appl. No.: 13/677,490

(22) Filed: Nov. 15, 2012

(65) Prior Publication Data

US 2014/0133848 A1    May 15, 2014

(51) Int. Cl.
  *H04B 10/08*   (2006.01)
  *H04B 17/00*   (2006.01)
  *H04B 10/00*   (2013.01)
  *H04L 1/00*    (2006.01)
  (Continued)

(52) U.S. Cl.
  CPC .......... *H04L 1/0076* (2013.01); *H04B 10/0799* (2013.01); *H04L 1/0009* (2013.01); *H04L 1/0057* (2013.01); *H04L 1/20* (2013.01); *H03M 13/033* (2013.01); *H03M 13/1102* (2013.01); *H03M 13/2957* (2013.01); *H03M 13/353* (2013.01); *H03M 13/6331* (2013.01)

(58) Field of Classification Search
  CPC ...... H03F 1/3247; H03F 1/3282; H04L 27/34;
      H04L 1/0009; H04L 1/0076; H04B 10/0799
  USPC .................................................... 398/25, 162
  See application file for complete search history.

(56) References Cited

U.S. PATENT DOCUMENTS 5,388,124 A * 2/1995 Laroia et al. ................ 375/286
5,541,955 A * 7/1996 Jacobsmeyer ............... 375/222
(Continued)

FOREIGN PATENT DOCUMENTS

EP    1394968 A2    3/2004
EP    2429083 A1    3/2012
(Continued)

OTHER PUBLICATIONS

Gallager R G et al.: "Variations on a Theme by Schalkwijk and Kailath," IEEE Transactions on Information Theory, IEEE Press, USA, vol. 56, No. 1. Jan. 1, 2010.

*Primary Examiner* — Ken Vanderpuye
*Assistant Examiner* — Abbas H Alagheband
(74) *Attorney, Agent, or Firm* — Dirk Brinkman; Gene Vinokur

(57) ABSTRACT

An adaptive coding scheme for nonlinear channels improves reliability and an efficiency in digital communication networks. The method monitors channel statistics to analyze an extrinsic information transfer chart of the channels. The channel statistics are fed back to the transmitter to adapt forward error correction coding. A parametric analysis method uses a Gaussian mixture model. The statistical information feedback can adapt an ARQ sheme by adding a weighted received signal to the original coded signals to reduce nonlinear distortion. Trellis shaping can make the transmitting signal preferable for nonlinear channels.

8 Claims, 6 Drawing Sheets

(51) Int. Cl.
  *H04B 10/079* (2013.01)
  *H04L 1/20* (2006.01)
  *H03M 13/03* (2006.01)
  *H03M 13/11* (2006.01)
  *H03M 13/29* (2006.01)
  *H03M 13/35* (2006.01)
  *H03M 13/00* (2006.01)

(56) References Cited

U.S. PATENT DOCUMENTS

| | | | | |
|---|---|---|---|---|
| 5,854,812 | A * | 12/1998 | Huber et al. | 375/296 |
| 5,940,439 | A * | 8/1999 | Kleider et al. | 375/225 |
| 6,154,489 | A * | 11/2000 | Kleider et al. | 375/221 |
| 6,252,912 | B1 * | 6/2001 | Salinger | 375/278 |
| 6,341,023 | B1 * | 1/2002 | Puc | 398/79 |
| 6,433,904 | B1 * | 8/2002 | Swanson et al. | 398/91 |
| 6,504,831 | B1 * | 1/2003 | Greenwood et al. | 370/342 |
| 7,162,675 | B2 * | 1/2007 | Das et al. | 714/751 |
| 7,251,297 | B2 * | 7/2007 | Agazzi | 375/340 |
| 7,715,731 | B2 * | 5/2010 | Elahmadi et al. | 398/189 |
| 8,068,735 | B2 * | 11/2011 | Stango et al. | 398/79 |
| 8,098,752 | B2 * | 1/2012 | Hwang et al. | 375/260 |
| 8,526,823 | B2 * | 9/2013 | Swanson et al. | 398/136 |
| 2002/0114038 | A1 * | 8/2002 | Arnon et al. | 359/145 |
| 2003/0069996 | A1 * | 4/2003 | Parrott | 709/250 |
| 2003/0072494 | A1 * | 4/2003 | Onno | 382/253 |
| 2003/0097623 | A1 * | 5/2003 | Razavilar et al. | 714/704 |
| 2004/0105687 | A1 * | 6/2004 | Myong et al. | 398/202 |
| 2004/0156644 | A1 * | 8/2004 | Yasue et al. | 398/198 |
| 2004/0205482 | A1 * | 10/2004 | Basu et al. | 715/500.1 |
| 2005/0138524 | A1 | 6/2005 | Cioffi | |
| 2006/0067685 | A1 * | 3/2006 | Gottwald | 398/25 |
| 2006/0245757 | A1 * | 11/2006 | Elahmadi et al. | 398/135 |
| 2007/0206960 | A1 * | 9/2007 | Nissov et al. | 398/188 |
| 2007/0237181 | A1 * | 10/2007 | Cho et al. | 370/478 |
| 2008/0188190 | A1 * | 8/2008 | Prasad et al. | 455/114.3 |
| 2009/0177945 | A1 * | 7/2009 | Djordjevic et al. | 714/758 |
| 2009/0279772 | A1 * | 11/2009 | Sun et al. | 382/141 |
| 2010/0052778 | A1 * | 3/2010 | Baranauskas et al. | 330/109 |
| 2010/0082291 | A1 | 4/2010 | Wen et al. | |
| 2010/0091900 | A1 * | 4/2010 | Gan | 375/267 |
| 2011/0026928 | A1 * | 2/2011 | Stango et al. | 398/83 |
| 2011/0103493 | A1 * | 5/2011 | Xia et al. | 375/259 |
| 2011/0268449 | A1 * | 11/2011 | Berlin et al. | 398/115 |
| 2013/0170842 | A1 * | 7/2013 | Koike-Akino et al. | 398/208 |

FOREIGN PATENT DOCUMENTS

| | | |
|---|---|---|
| GB | 2424134 A | 9/2006 |
| WO | 9411955 A1 | 5/1994 |
| WO | 2010093332 A1 | 8/2010 |

* cited by examiner

200

300

400

500

ADAPTIVELY CODING AND MODULATING SIGNALS TRANSMITTED VIA NONLINEAR CHANNELS

FIELD OF THE INVENTION

This invention relates generally to digital communications, and more particularly adaptively coding signals for nonlinear channels.

BACKGROUND OF THE INVENTION

Forward error correction (FEC) coding can reduce errors caused by noisy channels. FEC coding can be optimized by curve fitting with an extrinsic information transfer (EXIT) chart. When the channel state is time varying, the FEC coding should be changed according to the channel state. This is usually done by using adaptive coding and modulations. However, none of the existing adaptive coding methods can adjust for nonlinear channels which limits the advantage of FEC coding, especially in optical communications.

Optical communications have different characteristics than wireless communications. First, the interaction between the light signal and medium is complex. Second, optical signals are typically transmitted via a unidirectional optical fiber. Hence, optical networks use one channel from the transmitter to the receiver, and another channel from the receiver to the transmitter. Thus, the two channels are asymmetric, unlike in wireless communications, and the reverse channel does not mirror the forward channel. However, optical channels do not vary as much as wireless channels over time. Thus, channel states tend to be effective for longer time periods, and instantaneous channel state is less critical.

Adaptive precoding performs amplitude, phase control and data control to reduce errors b using a priori information of the channel state. Methods for precoding include Tomlinson-Harashima precoding, dirty paper coding, trellis shaping, time reversal precoding, inverse channel filtering, vector perturbation and predistortion. None of those methods are suited for complex time varying nonlinear channels.

Digital back-propagation (DBP) can be used for nonlinear channels in optical communications. However, DBP has many drawbacks. DBP is weak against stochastic noise, needs high-complexity operations, and a parameter mismatch to the actual channel state causes additional distortion.

In linear channels, it is known that the encoding and decoding complexity is significantly decreased, and the error probability is considerably reduced when feedback information from the receiver is available at the transmitter. An automatic-repeat request (ARQ) is one example of such. The well known Schalkwijk-Kailath (S-K) feedback coding scheme achieves channel capacity at a doubly-exponential decaying error probability without any FEC coding. However, there is no successful applications, and unified theory about the use of feedback for nonlinear channels.

SUMMARY OF THE INVENTION

Embodiments of the invention provide an adaptive coding for linear and nonlinear channels to improve reliability and efficiency in digital communications networks. The method monitors channel statistics to generate and analyze an extrinsic information transfer (EXIT) chart of the channels. The channel statistics are fed back to the transmitter to adapt forward error correction (FEC) preceding and encoding.

One embodiment of the invention provides parametric analysis of nonlinear channel statistics by using a Gaussian mixture model (GMM). The statistical parameters are estimated by an expectation-maximization (EM) process. For nonparametric analysis, the channel statistics are represented by a multi-dimensional histogram of the multi-variate received signals to build several moments (mean, variance, skewness, etc.).

Using either parametric or nonparametric statistics, the EXIT curve is obtained by another histogram of extrinsic mutual information, given a priori mutual information to adapt the FEC coding.

One embodiment of the invention optimizes low-density parity-check (LDPC) codes, based on the EXIT chart information available at the transmitter. The degree distribution of LDPC variable nodes and check nodes are redesigned by curve fitting of the EXIT chart, with a consideration of practical decoder aspects, including a maximum number of iterations, fixed-point arithmetic precision, and finite length of codes.

Another embodiment of the invention provides an automatic repeat request (ARQ) based on Schalkwijk-Kailath (S-K) feedback coding generalized for nonlinear channels by feeding back the received signal. The transmitter adds a weighted received signal to the encoded signal, which can exponentially decrease an equivalent nonlinear distortion.

Another embodiment of the invention adapts precoding (e.g., trellis shaping), which intentionally adapts the data so that the transmitting signal is more preferable for nonlinear channels to reduce distortion. The optimal precoding can be redesigned by using statistical information of the channel, and a regenerative model based on GMM and Volterra series expansion.

DETAILED DESCRIPTION OF THE PREFERRED EMBODIMENT

Embodiments of the invention provide adaptive coding for linear and nonlinear channels to improve reliability and efficiency in digital communications networks.

Method and Network

Figure 1:
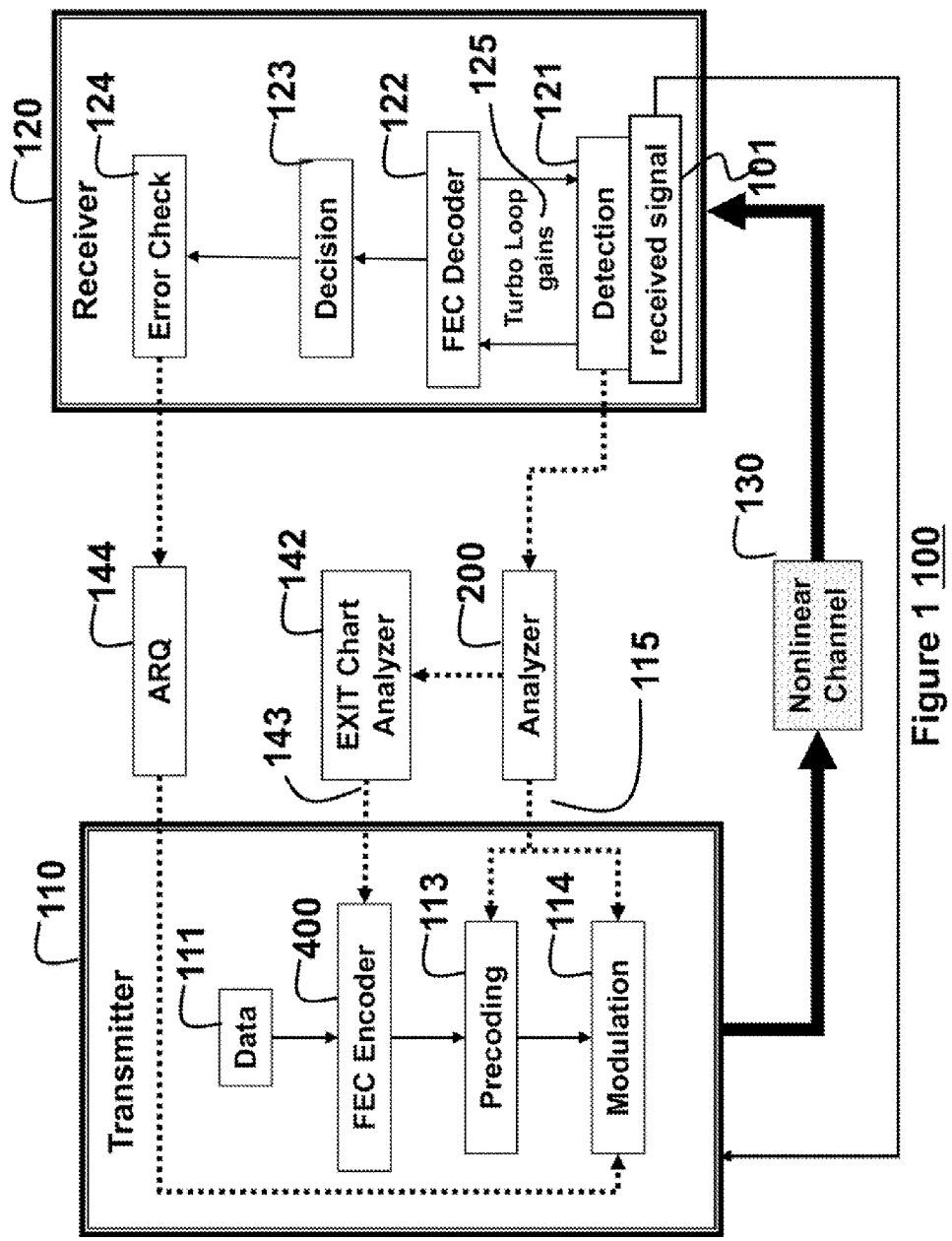
FIG. 1 is a schematic of a method and communications network with adaptive coding according to embodiments of the invention.

FIG. 1 shows a preferred embodiment of a method and network 100 according to embodiments of the invention. The network includes a transmitter 110 and a receiver 120 to transfer data 111 via linear, nonlinear, and noisy channels 130 in e.g., optical fiber, satellite, and other types of noisy communication networks.

The transmitter has data 111 for an FEC encoder 400. The encoded data can be adapted by a precoding block 113, and are transmitted after modulation 114 as a signal, e.g., an optical or radio signal, via a linear, nonlinear or noisy channel 130.

A distorted received signal 101 is detected 121 at the receiver 120, e.g., by an equalizer. The detected signal is FEC decoded 122 to reduce errors. The FEC decoded information can be fed back to the detector block to achieve turbo loop gains 125.

The output of the FEC decoder is used to decide 123 the transmitted data. The decision can be monitored by an error checker 124. An ARQ is generated 144 when the receiver detects errors in the decoded data.

Channel Statistics

The invention improves the reliability and efficiency using channel state information (CSI) The method analyzes 200 the channel statistics using the received signal 101. An EXIT chart is generated and analyzed 142 by measuring a histogram of the detection output given the FEC decoder feedback information.

The channel statistics 115 are fed back to the transmitter so that the precoder can be adapted according to the channel state.

The EXIT chart information 143 is used by the transmitter so that the FEC codebook is improved according to the channel state.

Then, the ARQ can cause retransmission with an improved modulation format.

Figure 2:
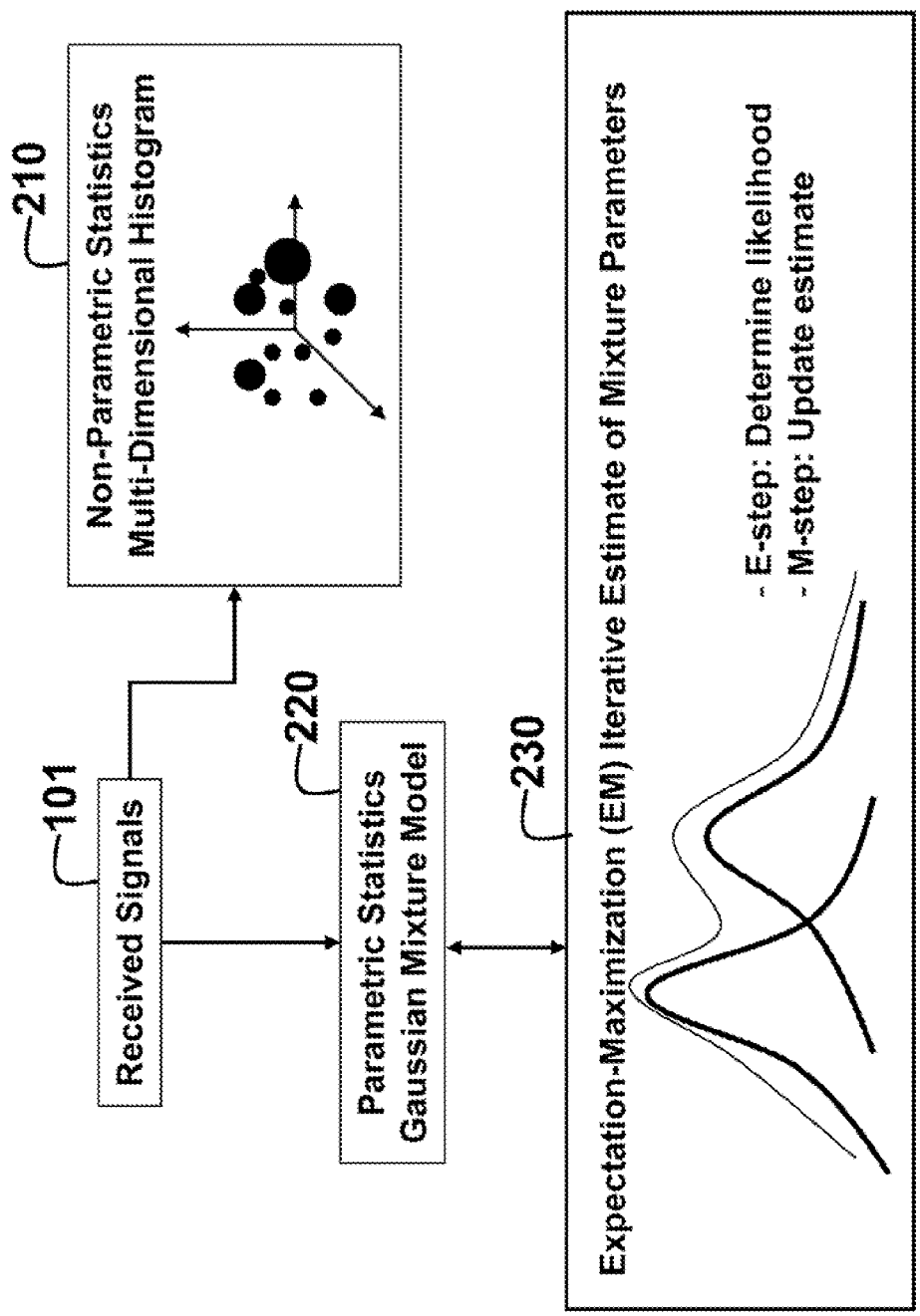
FIG. 2 is a schematic of channel statistics estimation according to embodiments of the invention.

FIG. 2 shows the channel analyzer 200 for nonparametric and parametric statistical models. The nonparametric model constructs a table 210 which represents a multi-dimensional histogram of the received signal 101.

A parametric Gaussian mixture model (GMM) 220 represents the histogram analytically. The GMM his multiple parameters to estimate for well describing the histogram. The GMM is estimated by an expectation-maximization (EM) process 230, which is an iterative solution of an approximate maximum likelihood (ML).

In the expectation step, the likelihoods of the estimate are determined, while the estimate is updated to locally maximize the likelihoods in the maximization step. The received signals are typically correlated, and hence, the effective dimensionality can often be reduced by principle component analysis (PCA) or linear discrimination analysis (LDA). Alternative to the parametric GMM, other model can be used.

The EXIT curve is obtained by another histogram of the extrinsic mutual information given a priori mutual information to adapt the FEC coding.

Optimization of LDPC Codes

Figure 3:
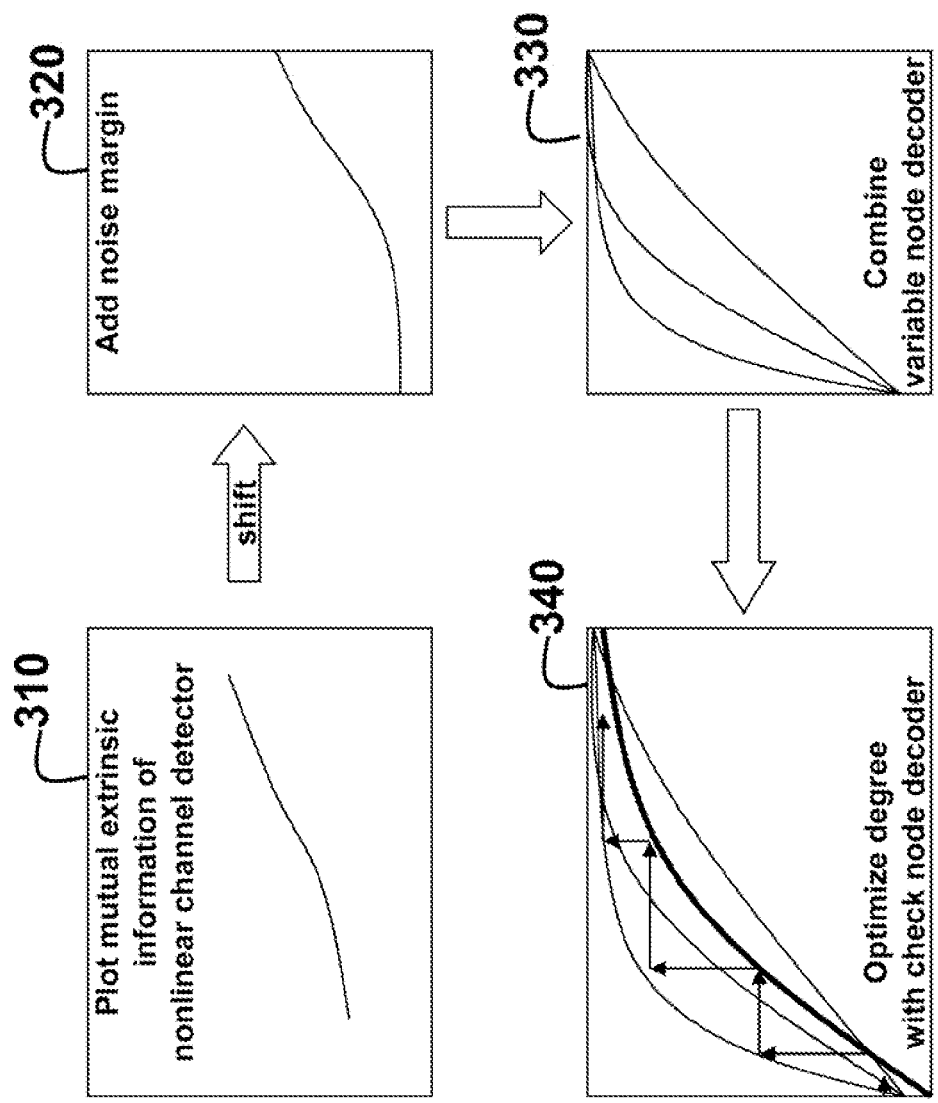
FIG. 3 is a schematic of an EXIT-based Optimization of LDPC codes according to embodiments of the invention.

FIG. 3 schematically shows an optimization procedure 300 for LDPC codes based on the EXIT chart available at the transmitter. The EXIT curve of the nonlinear channel detector is plotted 310 according to the histogram of the information between the detector 121 and the FEC decoder 122.

The EXIT curve is shifted 320 by adding a noise margin so that the adapted LDPC coder can still operate in noisy conditions caused by receiver imperfection, such as a circuit noise, channel estimate error, and precision loss. The shifted EXIT curve is combined 330 with the EXIT curve of the variable node decoder, where the curve is predetermined by fixed-point operation decoding simulations. The obtained curves and the EXIT curve of check node decoder are used to optimize 340 the degree distribution of the LDPC coder.

The conventional optimization performs curve-fitting with linear programming. In contrast the embodiments of the invention directly use the iteration trajectory, rather than the curve fitting so that the error probability is less than a predefined threshold, e.g. $10^{-15}$, within the maximum number of turbo loop iterations 125, e.g., five times. The coding rate can be optimized at the same time. The coding optimization can be done, e.g., by a modified density evolution.

LDPC Coding

Figure 4:
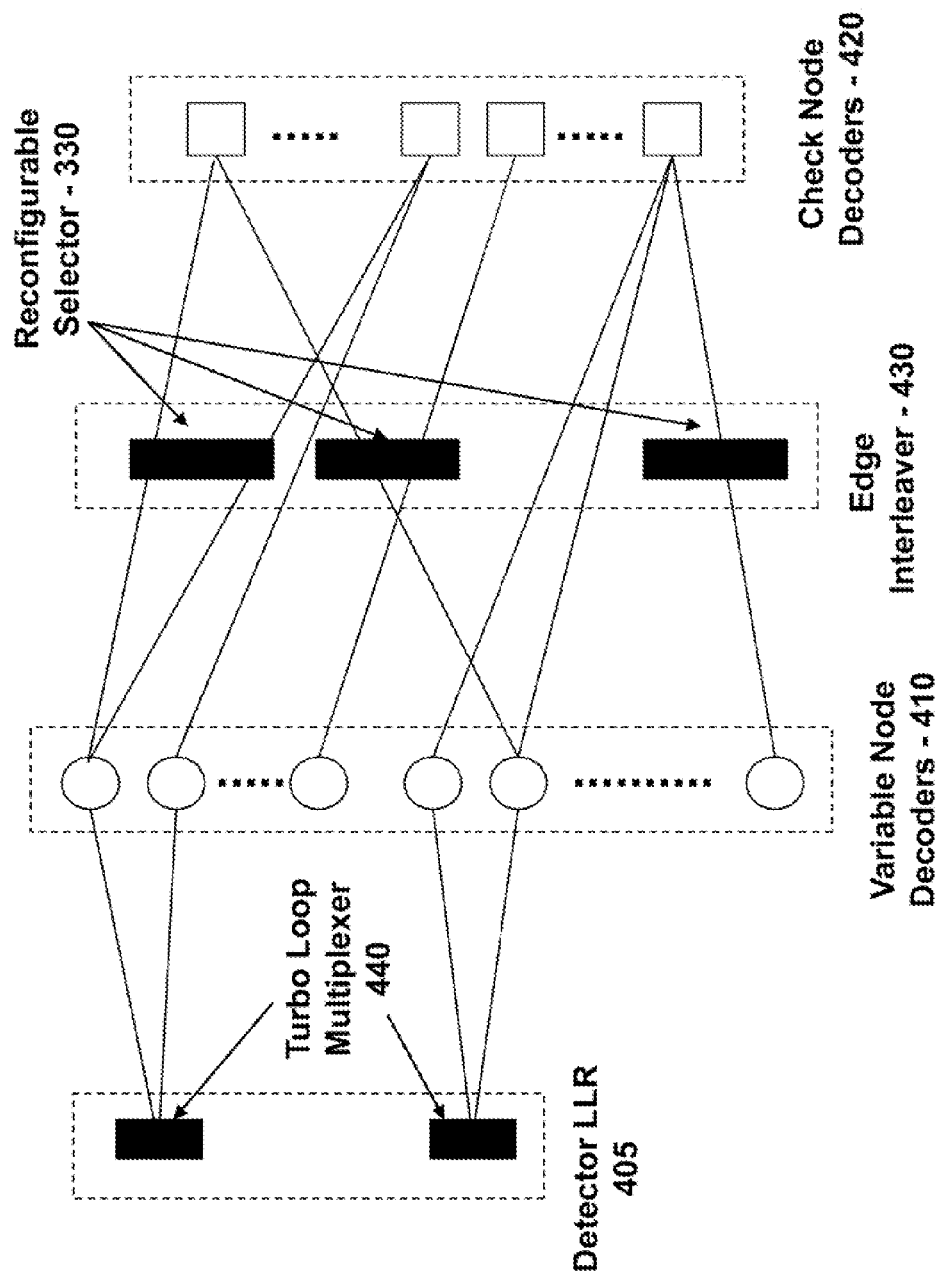
FIG. 4 is a schematic of an adaptive LDPC encoder and decoder according to embodiments of the invention.

FIG. 4 shows an apaptable LDPC encoder and decoder 400. Adaptive LDPC coding changes the degree distribution of edges between variable node decoders 410 and check node decoders 420, according to the channel statistics and EXIT chart information. Hence, an edge interleaver implements adaptable selectors 430 to add and delete intended edges when the EXIT-based LDPC optimization determines a change of edges to improve performance.

For turbo loop operations, the log-likelihood ratio (LLR) 405 information from detector can be updated by turbo loop multiplexers 440, which pass belief information from the variable node decoders to the adjacent variable node decoders. Such multiplexers can be implemented by conditional adders when the turbo equalization is approximated by maximum-logarithmic (max-log) functions.

S-K Feedback for ARQ

Another embodiment of the invention the ARQ 144 is based on the S-K feedback coding, generalized for nonlinear channels by feeding back the received signal 101.

Figure 5:
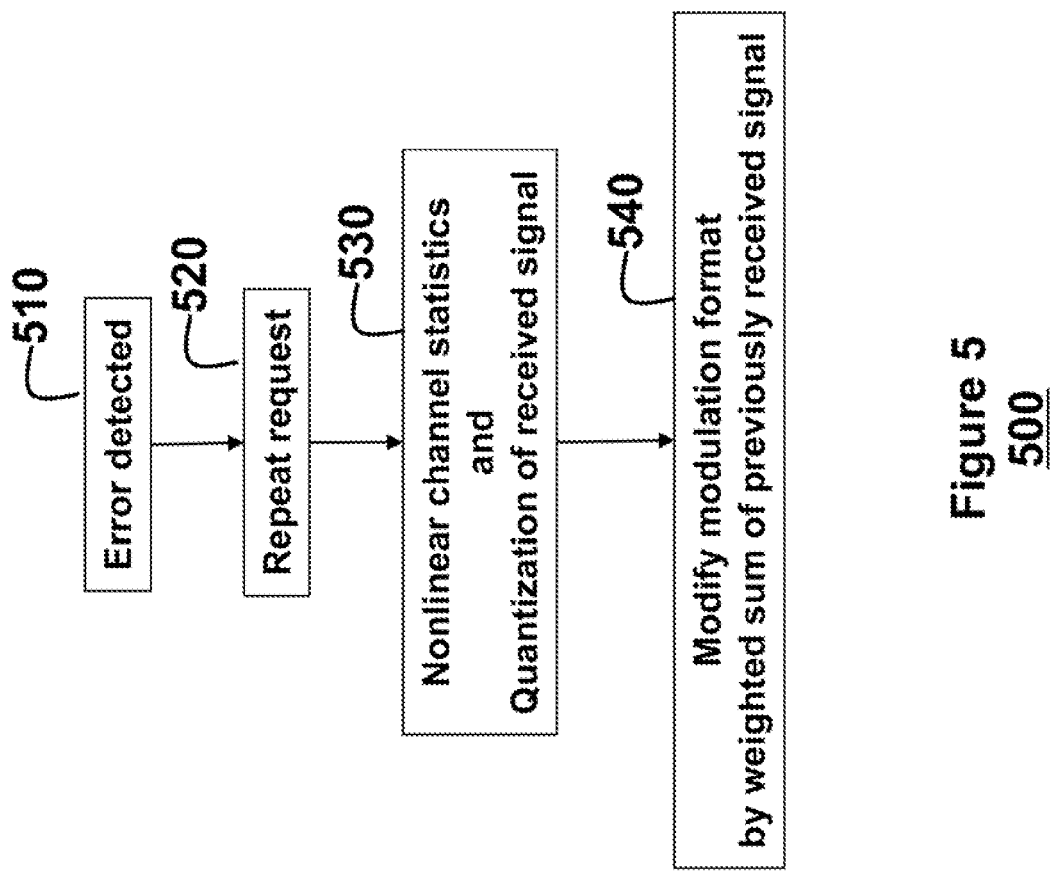
FIG. 5 is a schematic of ARQ based on S-K feedback coding according to embodiments of the invention.

FIG. 5 shows the S-K feedback 500 for nonlinear channel statistics. When an error is detected 510, the ARQ is fed back 520 to the transmitter with the channel statistics and quantized received signals. The transmitter can regenerate the received signal 101 by using the channel statistics and the quantized received signal 530. Based on the error, the modulation format can be adapted 540 by adding a weighted sum of the received signals so that the receiver has exponentially decaying nonlinear distortion. A similar procedure can be used for any other ARQ method.

Adaptive Coding

The other embodiment of the invention provides an adaptive precoding based on trellis shaping, which intentionally adapts the data 111 so that the transmitting signal is preferable for nonlinear channels to reduce distortion.

Figure 6:
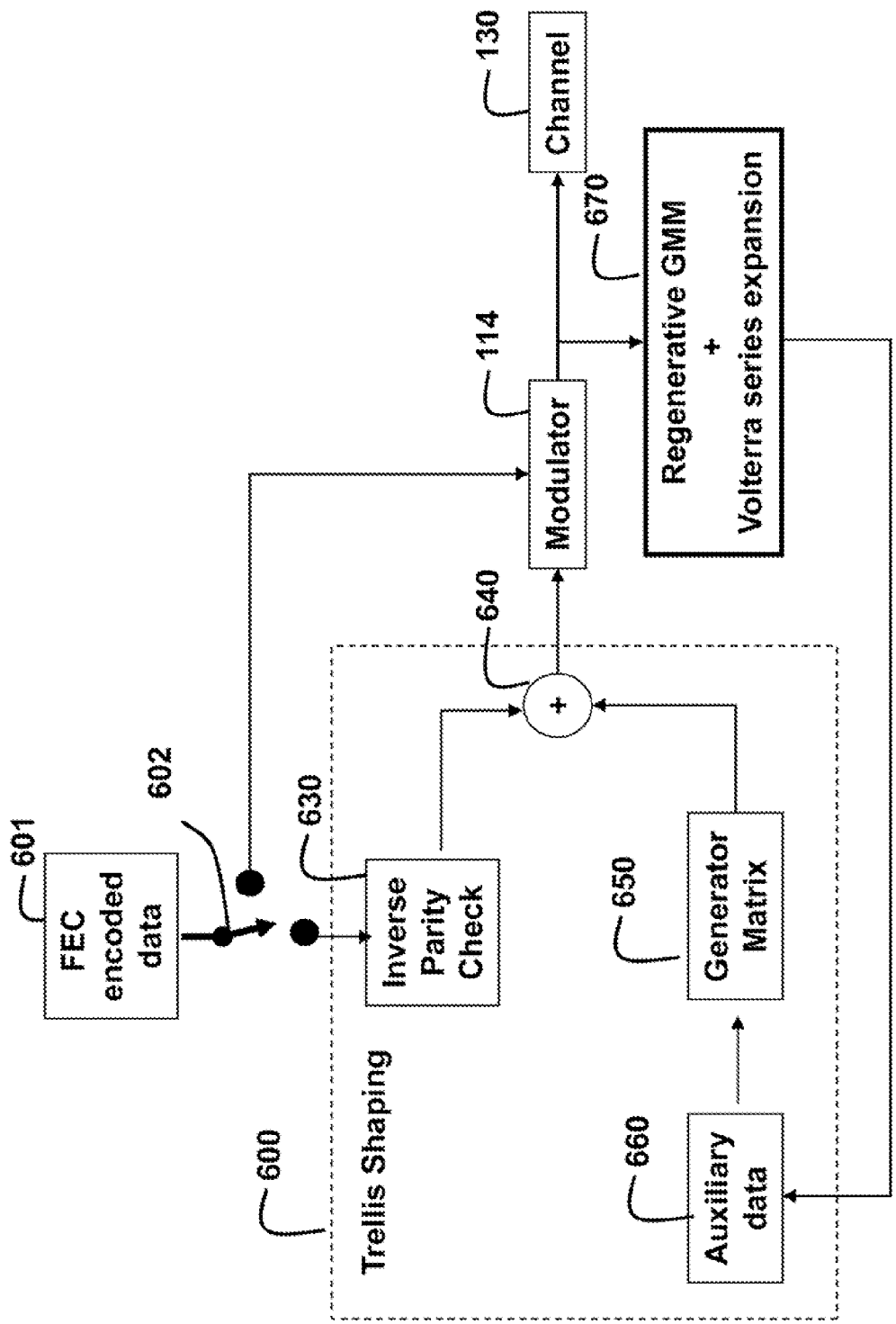
FIG. 6 is a schematic of adaptive precoding based on trellis shaping according to embodiments of the invention.

FIG. 6 shows the method for trellis shaping 600 for nonlinear channels. This essentially replaces the precoding block 113 of FIG. 1.

When no precoding is used, the FEC encoded data 601 is directly fed to the modulation block 114 via the switch 602.

If the receiver has the channel statistics and regenerative GMM model, with the help of Volterra series expansion 670, then the FEC encoded data are fed, via a trellis shaping block 620, to the modulation block 114.

In the trellis shaping block, the FEC encoded data are encoded by an inverse parity check matrix 630 of a convolutional code. The parity check output is summed 640 with other encoded data, which is an output of a corresponding generator matrix 650 generated from auxiliary data 660. The combined data are then modulated 114 and transmitted via the channel 130.

The auxiliary data 660 are optimized so that the transmitted signal can minimize the nonlinear distortion in the channel by using the regenerative model of GMM and Volterra series expansion 670. This is done by a Viterbi process to search for the optimal data which minimize the distortion power.

The receiver uses the parity check to remove the auxiliary data. An analogous method can work for any other precoding schemes, such as vector purtebation.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. An optical communications network, comprising:
   an optical transmitter, further comprising:
      a forward error correction (FEC) encoder;
      a precoder: and
      a modulator;
   an optical receiver, further comprising:
      a detector;
      a FEC decoder;
      a decision block; and
      an error check block;
   an optical fiber connecting the optical transmitter and the optical receiver;
   a first analyzer, connected between the optical transmitter and the optical receiver, configured to generate an extrinsic information transfer (EXIT) chart, and adapting the FEC encoder according to the EXIT chart; and
   a second analyzer, connected between the optical transmitter and the optical receiver, configured to generate nonlinear statistics of an optical channel in the optical fiber between the optical transmitter and the optical receiver, and adapting, the precoder and the modulator according to the nonlinear statistics.

2. The network of claim 1, wherein the encoder is a forward error correcting encoder.

3. The network of claim 1, further comprising:
   measuring a histogram of an output of the detector given feedback information from the FEC decoder to generate the (EXIT) chart.

4. The network of claim 1, further comprising:
   generating an automatic-repeat request (ARQ) to initiate retransmission of data with an improved modulation format and adaptive Schalkwijk-Kailath coding.

5. The network of claim 3, wherein the histogram is based on nonparametric and parametric statistical models, and the parametric model is a Gaussian mixture model (GMM) estimated by an expectation-maximization (EM) process.

6. The network of claim 5, wherein the GMM is estimated by locally maximizing likelihoods during the maximization.

7. The network of claim 1, wherein receiver has exponentially decaying nonlinear distortion.

8. The network of claim 1, wherein the precoder is based on trellis shaping, which intentionally adapts the data so that a transmitting signal is preferable for nonlinear channels to reduce distortion.

* * * * *